United States Patent [19]

Seto

[11] Patent Number: 5,683,023
[45] Date of Patent: Nov. 4, 1997

[54] APPARATUS FOR SEPARATING MICRO-JOINT PROCESSED PRODUCTS AND DIE USED THEREFOR

[75] Inventor: Yoshiharu Seto, La Mirada, Calif.

[73] Assignee: Amada MFG America, Inc., La Mirada, Calif.

[21] Appl. No.: 613,980

[22] Filed: Mar. 11, 1996

Related U.S. Application Data

[63] Continuation of Ser. No. 400,527, Mar. 7, 1995, Pat. No. 5,577,312, which is a continuation of Ser. No. 184,445, Jan. 21, 1994, abandoned.

[51] Int. Cl.$^6$ .................................................. B26F 3/00
[52] U.S. Cl. .................................................. 225/103; 225/2
[58] Field of Search .............................. 29/412, 413, 414, 29/418, 426.1, 426.2, 426.4, 426.5, 700; 225/103, 2, 104, 105; 83/25, 27

[56] References Cited

U.S. PATENT DOCUMENTS

| | | |
|---|---|---|
| 3,190,094 | 6/1965 | Kutas . |
| 3,317,100 | 5/1967 | Flemming et al. . |
| 3,338,084 | 8/1967 | Stegman, Sr. . |
| 3,464,104 | 9/1969 | Tonner et al. . |
| 4,285,754 | 8/1981 | DiMatteo . |
| 4,400,861 | 8/1983 | Parker . |
| 4,503,744 | 3/1985 | Garner et al. . |
| 4,509,355 | 4/1985 | Oishi . |
| 4,546,683 | 10/1985 | Völkel et al. . |
| 5,027,505 | 7/1991 | Nakamura et al. . |
| 5,104,023 | 4/1992 | Nishiguchi et al. . |

FOREIGN PATENT DOCUMENTS

| | | |
|---|---|---|
| 3926714 | 2/1991 | Germany . |
| 36094 | 2/1990 | Japan . |
| 4-901-24 | 8/1992 | Japan . |
| 5-13624 | 2/1993 | Japan . |

*Primary Examiner*—David P. Bryant
*Attorney, Agent, or Firm*—Wigman, Cohen, Leitner & Myers, P.C.

[57] ABSTRACT

In a method of separating a product G connected to a skeleton portion S of work W via a micro joint M, from the skeleton portion, the product is separated from the skeleton portion by striking the skeleton portion in the vicinity of the micro joint to cut off the micro joint from the skeleton. Further, the die pair used for the above-mentioned method comprises a punch 17A provided with a projecting portion 17T at an end thereof and movable up and down; and a die 19A arranged under the punch and formed of an elastic substance. In this method, it is possible to separate products from the skeleton portion of the work efficiently by breaking the micro joints without scratching the products and without generating noise. Further, the separating work of the products from the skeleton portion can be easily automated.

8 Claims, 5 Drawing Sheets

APPARATUS FOR SEPARATING MICRO-JOINT PROCESSED PRODUCTS AND DIE USED THEREFOR

This is a continuation of application Ser. No. 08/400,527 filed on Mar. 7, 1995, now U.S. Pat. No. 5,577,312, which is a continuation of application Ser. No. 08/184,445 filed on Jan. 21, 1994, now abandoned.

BACKGROUND OF THE INVENTION

1. Field of the Invention

The present invention relates to a method of separating products, each connected to a skeleton portion of work via micro joints, from the skeleton portion, and a pair of punch and die used for the above-mentioned method.

2. Description of the Prior Art

In the conventional plate material processing such that products are punched out of work through punch press processing, laser processing, plasma jet processing, etc., a minute non-cut off portion (referred to as a micro joint) is formed at a corner of each product so that the punched-out product will not be separated from a skeleton portion of work. Further, after a sheet of the plate material has been all processed, these micro joints are broken off to separate the processed products from the remaining skeleton portion of the work.

Conventionally, the products processed under connection to the work through the micro joints have been so far separated from the remaining skeleton portion of the work by use of a hummer, by manual work (a worker holds both ends of the skeleton portion by his hands and shake the skeleton portion up and down), or by cutting off the micro joints away from the skeleton portion by use of a micro joint separator, for instance as disclosed in Japanese Published Unexamined (Kokai) Utility Model Application Nos. 5-13624 and 4-90124.

With respect to the conventional methods of separating the products from the work skeleton portion, the separating work is heavy labor in the case of the manual separation; and the workability is low in the case of the micro joint separator because the micro joints must be separated from the remaining work skeleton portion with the use of a vibrating apparatus. In particular, in the conventional micro joint separating apparatus, the automation has been so far difficult because the positional information related to the respective micro joints must be detected, and in addition it is difficult to confirm that products have been separated from the skeleton portion perfectly. Further, in any cases, there exist other problems in that the products are scratched or depressed; large sound noise is generated; and additional works (for assortments or accumulation) are required after the products have been separated.

SUMMARY OF THE INVENTION

With these problems in mind, therefore, it is the object of the present invention to provide a method of separating micro-joint processed products from a skeleton portion of work and a die used therefor, by which the separating work can be achieved at a high efficiency without scratching the products and generating noise, and further the separating work can be automatized easily.

To achieve the above-mentioned object, the present invention provides a method of separating a product, connected to a skeleton portion of work via a micro joint, from the skeleton portion, wherein the product is separated from the skeleton portion by striking the skeleton portion in the vicinity of the micro joint to cut off the micro joint from the skeleton.

Further, in the method of the present invention, the die comprises a punch provided with a projecting portion at an end thereof and movable up and down; and a die arranged under said punch and formed of an elastic substance. Or else, the die comprises a punch provided with a projecting portion at an end thereof and movable up and down; and a die arranged under said punch and provided with an elastic substance at a position opposite to the projecting portion of said punch.

In the method of separating a product, connected to a skeleton portion of work via a micro joint, from the skeleton portion according to the present invention, the products are processed in such a way that the products can be connected to the skeleton portion of work via micro joints. The micro joints are located on the die, and then the skeleton portion is punched off in the vicinity of the micro joints, so that the micro joints can be punched off to separate the products from the skeleton portion.

DETAILED DESCRIPTION OF THE PREFERRED EMBODIMENTS

The embodiments of the present invention will be described hereinbelow with reference to the attached drawings.

Figure 6:
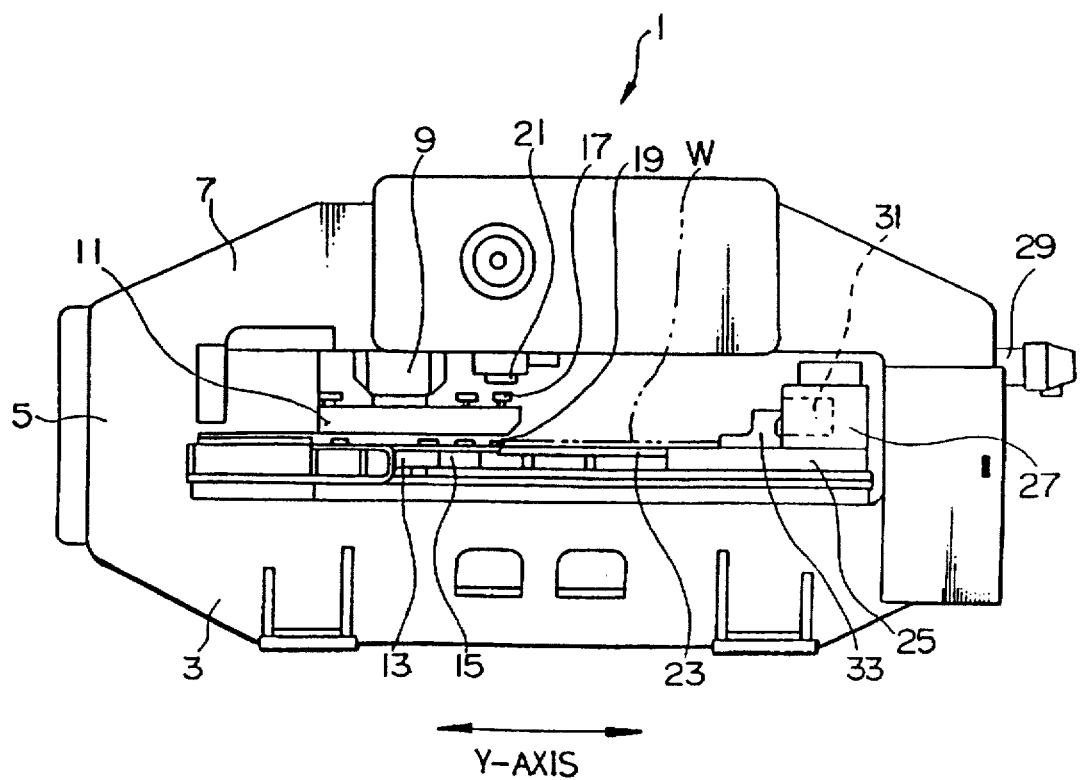
FIG. 6 is a front view showing a turret punch press, to which the method of the present Invention is applied for processing of forming and cutting off the micro joints.

With reference to FIG. 6, a turret punch press 1 is constructed into a portal shape integrally with a lower frame 3, right and left columns 5, and an upper frame 7. A rotary axle 9 is rotatably supported at the lower portion of the upper frame 7. An upper turret 11 is attached to the rotary axle 9.

Further, a rotary axle 13 is rotatably supported at the upper portion of the lower frame 3 at such a position as to correspond to the rotary axle 9.

A plurality of punches 17 are arranged along the circumference of the upper turret 17, and a plurality of dies 19 are also arranged along the circumference of the lower turret 15 at such positions as to correspond to the punches 17, respectively. Further, the processing position is determined on the right side of the upper and lower turrets 11 and 15. Further, a striker 21 is provided on the upper frame 7 movably up and down so as to strike the punch 17 at the processing position.

On the right side of the lower frame 3, a center table 23 is fixedly provided. In addition, on both sides of this center table 23 (on both the surfaces of paper in FIG. 6), side tables 25 are provided so as to be movable in the Y-axis direction (in the right and left direction In FIG. 6).

The side tables 25 are linked with a carriage base 27 on the right end thereof. When a Y-axis motor (e.g., servomotor) 29 mounted on the right end of the column 5 is driven, the side tables 25 can be moved in the Y-axis direction via a ball screw linked with the motor 29 and nut members (not shown) formed in the side tables, respectively.

On the carriage base 27, a carriage 31 extending in X-axis direction is mounted. This carriage 31 can be moved in the X-axis direction by a drive motor (not shown). Further, on this carriage 31, a plurality of work clamps 33 for holding work W are arranged at appropriate intervals.

Figure 5:
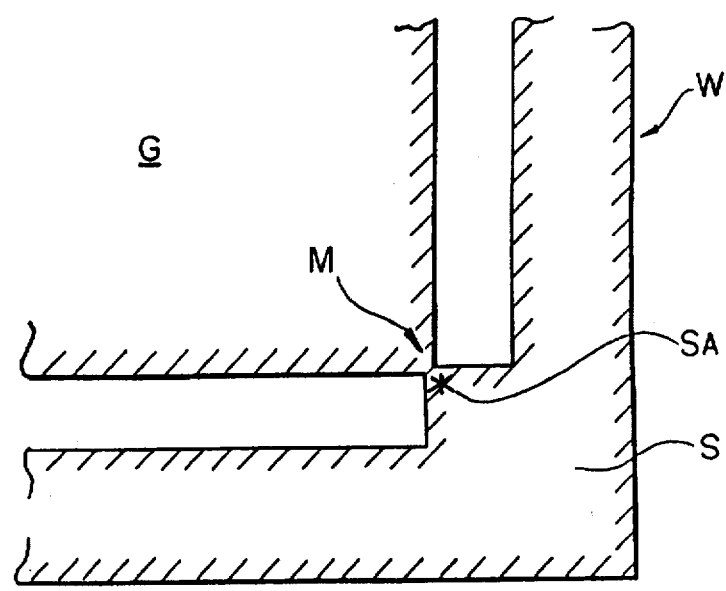
FIG. 5 is a plan view showing an example of work in which a product is connected to a skeleton portion thereof via a micro joint.

Therefore, when the work W is moved both in the X- and Y-axis directions, and located at the processing position so as to be punched in cooperation with both the punch 17 and the die 19, it is possible to process products G (only one is shown in FIG. 5) connected to a skeleton portion S of the work W via micro joints M (only one is shown in FIG. 5).

Figure 2:
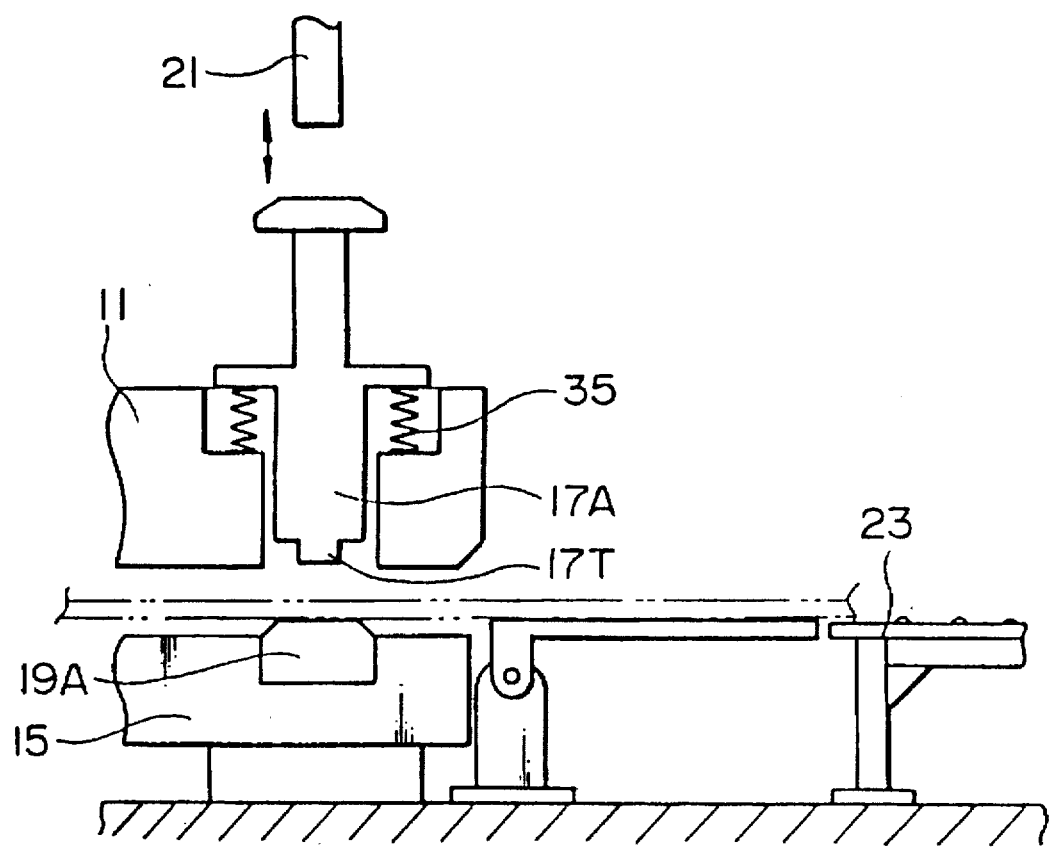
FIG. 2 is a front cross-sectional view showing a die used for the micro-joint processed product separating method according to the present invention.

FIG. 2 shows a pair of the punch 17 and the die 19 as an example of a plurality of sets of the punches and the dies arranged on the upper and lower turrets 11 and 15, respectively. In more detail, in FIG. 2, a push rod die 17A is attached to the upper turret 11 so as to be always urged in the upward direction by a lift spring 35, as a punch movable up and down. This push rod die 17A is formed integral with a projection portion 17T projecting downward at roughly the middle portion of the lower end of the die 17A. Further, the die 19A formed of an elastic substance such as urethane is attached to the lower turret 15.

Figure 1A:
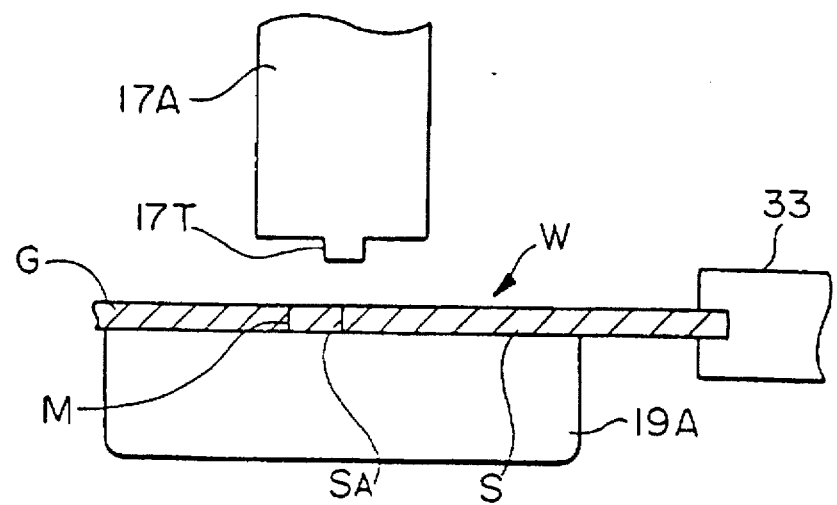
FIGS. 1(A) and (B) and (C) are cross-sectional views for assistance in explaining the operation of the micro-joint processed product separating method according to the present invention.

The operation of the punch and die as described above will be described hereinbelow with reference to FIGS. 1 and 5. The work W having products G connected to the skeleton portion S of the work via micro joints M as shown in FIG. 5 is clamped by the clamp 33, and then moved in the X- and Y-axis directions at such a part that a specific position SA of the skeleton portion S in the close vicinity of the micro joint M (see FIG. 5) can be located just over the die 19A arranged just under the projecting portion 17T of the push rod die (punch) 17A.

Figure 1B:
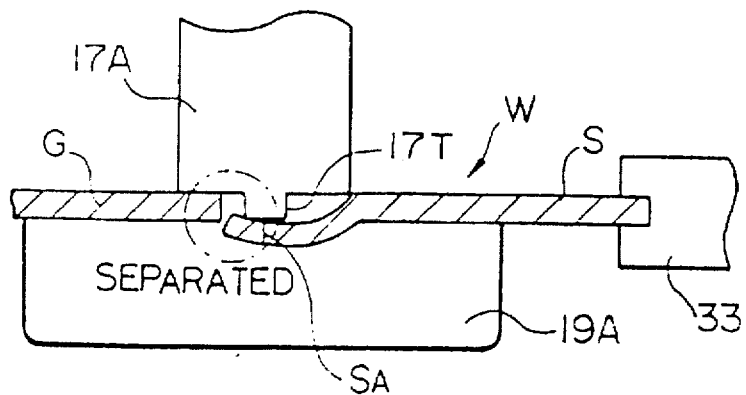

Successively, when the striker 21 is lowered to push the push rod die 17A, the projecting portion 17T of the push rod die 17A is brought into contact with the skeleton portion S in the vicinity of the micro joint M against an urging force of the lift spring 85. When the push rod die 17A is further lowered, since the projecting portion 17T pushes the specific part SA of the skeleton portion S downward, the elastic material of the die 17A is compressed, as shown in FIG. 1(B), with the result that the micro joint M is cut off to separate the product G from the skeleton portion S of the work W.

Figure 1C:
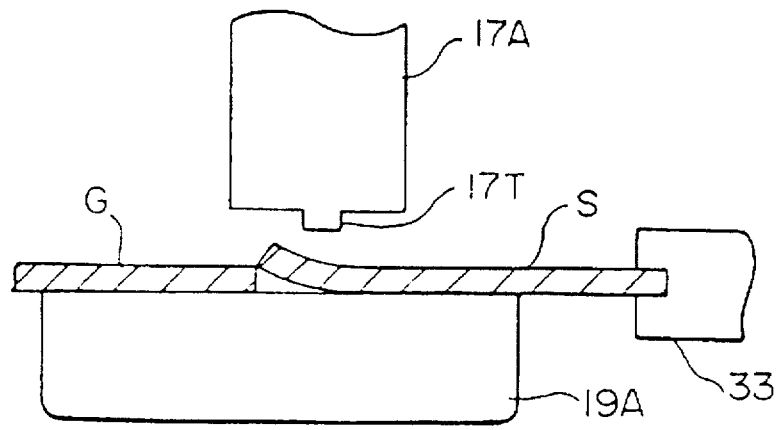

Then, when the push rod die 17A is lifted upward to the original position, an end portion of the skeleton portion S separated from the product G is raised slightly, as shown in FIG. 1(C).

As described above, in the method of the present invention, it is possible to cut off a plurality of micro joints M from the products G to separate the products G from the skeleton portion S of the work W whenever the skeleton portions S are punched off in the vicinity of the micro joints M. As the result, it is possible to separate the products G from the skeleton portion S efficiently by cutting off the micro joints M without scratching the products G and generating sound noise. In addition, it is possible to facilitate the automatization of the separating work of the products G from the skeleton portion S of the work W.

Further, a pair of the punch and die used for the method according to the present invention, as shown in FIG. 2, is simply composed of the push rod die 17A formed with the end projecting portion 17A and the die 19A formed of an elastic substance, so that it is possible to manufacture a pair of the punch and die simply and further to reduce the noise generated when the micro joints M are broken off.

Figure 3A:
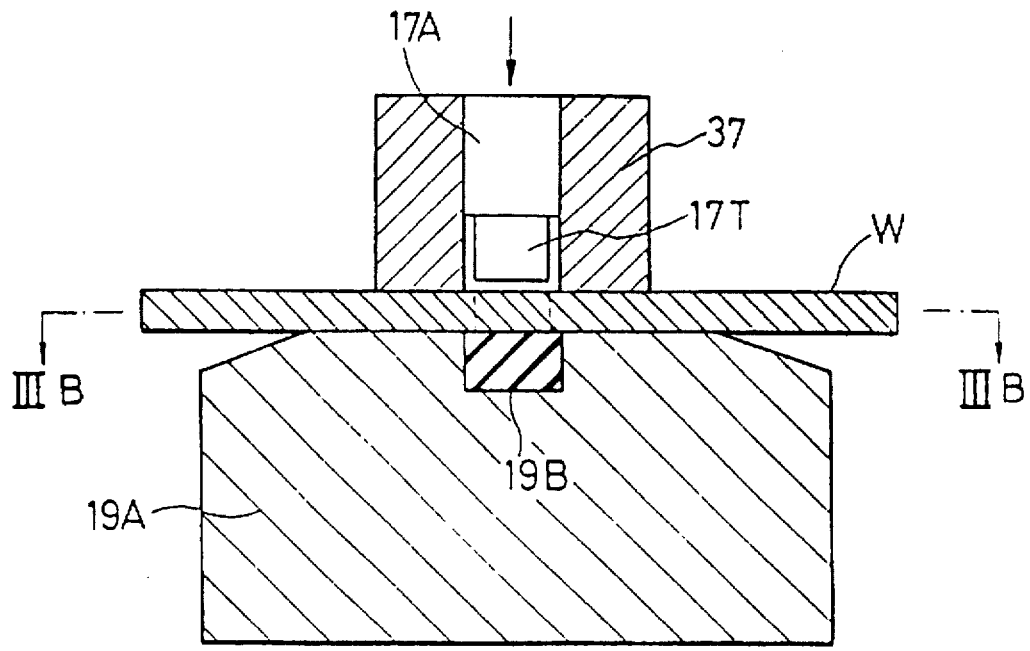
FIGS. 3(A) and (B) are a cross-sectional view and a top view for assistance In explaining another embodiment of the die according to the present invention.
Figure 3B:
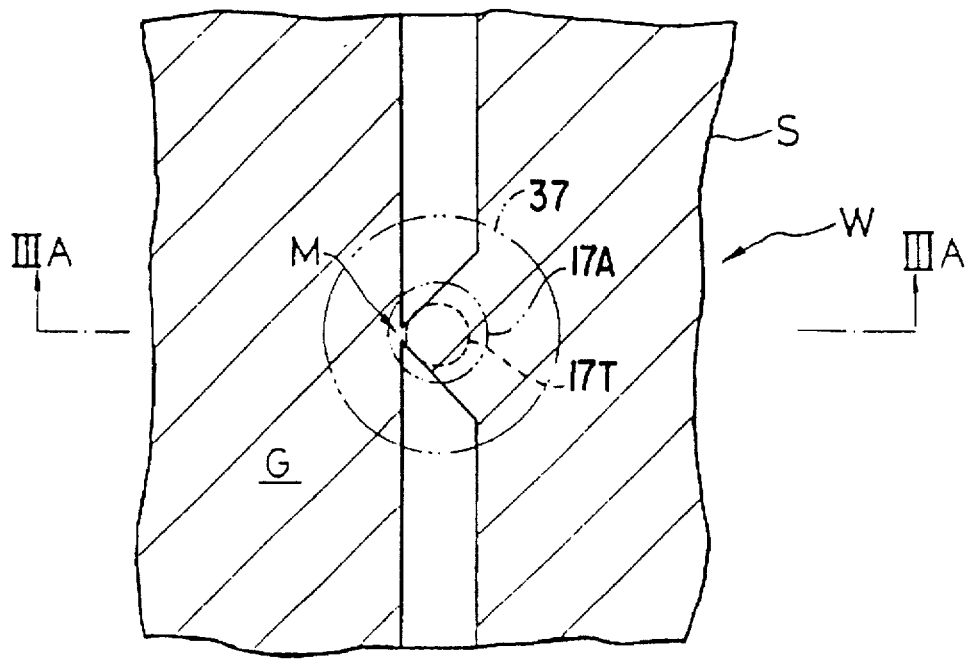

FIGS. 3(A) and (B) show another embodiment of a pair of the punch and die. In this embodiment, the push rod die 17A is attached to a stripper plate3 37, and formed with a standard or ordinary square-shaped (in cross section) projecting portion 17T at the end thereof, as shown in FIG. 3(A). Further, the die 19A is provided with an elastic substance 19B, such as urethane, at only a position opposite to the projecting portion 17T. By use of the punch and die as described above, it is possible to easily break the micro joints M by striking the skeleton portion S of the work W in the close vicinity of the micro joints M by the projecting portion 17T of the die 17A, as shown in FIG. 3(B).

In this embodiment, the die 19A is not formed entirely of the elastic substance, but the elastic substance 19B is attached only at a position opposite to the projecting portion 17T of the die 17A. Therefore, it is possible to absorb the noise generated when the micro joints M are broken and further to reduce the manufacturing cost thereof.

Figure 4A:
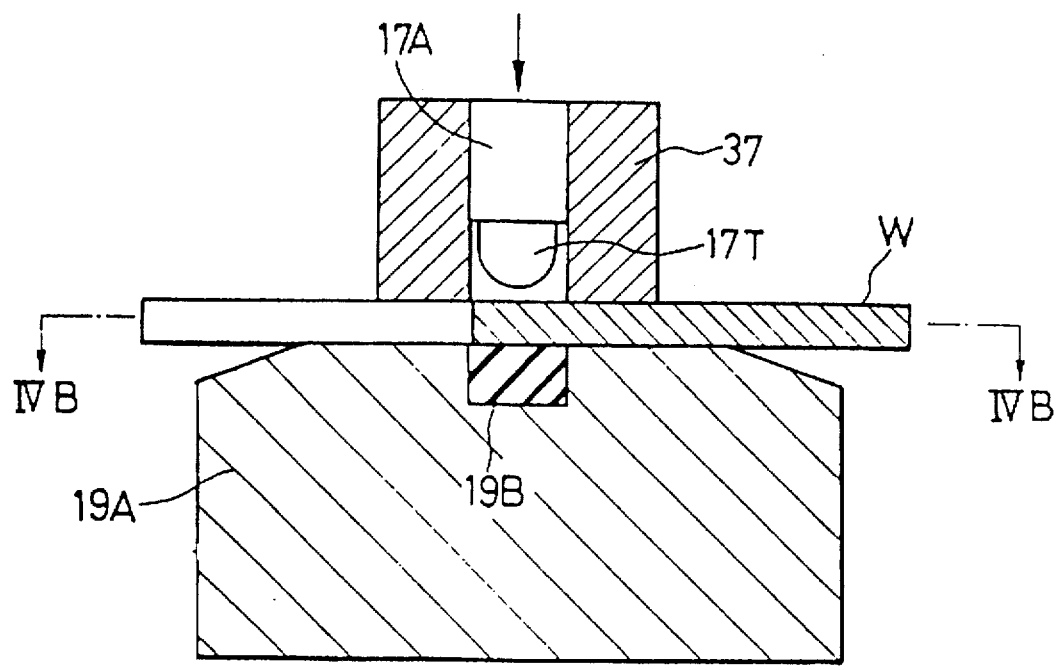
FIGS. 4(A) and (B) are a cross-sectional and a top view for assistance in explaining still another embodiment of the die according to the present invention.
Figure 4B:
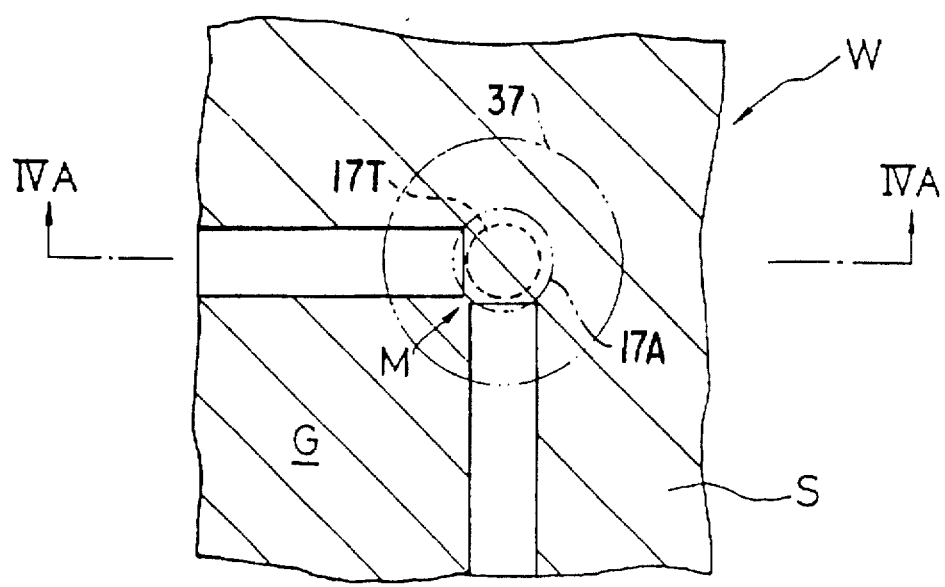

FIGS. 4(A) and (B) show still another embodiment of a pair of the punch and the die according to the present invention. In this embodiment, the push rod die 17A is attached to the stripper plate 37, and formed with a round-shaped (in cross section) projecting portion 17T at the end thereof, as shown in FIG. 4(A), instead of the square-shaped projecting portion 17T shown in FIG. 3(A). The structural feature and functional effects of this embodiment other than that described above are substantially the same as with the case of the embodiment as shown in FIG. 3(A), so that any detailed description thereof is omitted herein.

As described above, in the method of the present invention, it is possible to separate products from the skeleton portion of the work efficiently by breaking the micro joints without scratching the products and without generating noise, and in addition to facilitate the automation of the separating process of the products from the skeleton portion of the work.

Further, the present invention is not limited to only the embodiments as described above, and various changes and modifications may be made without departing from the spirit and scope of the invention.

What is claimed is:

1. Apparatus for separating a product connected to a skeleton portion of a workpiece at a micro joint which is located directly adjacent to said product, comprising:

a punch provided with a projecting portion at an end thereof and movable up and down;

a die arranged under said punch and formed of an elastic substance;

aligning means for moving the workpiece in two directions in a plane of the workpiece until a specific part of the skeleton portion in close vicinity of the micro joint is located just over the die and just under the projecting portion of the punch; and means for moving said projecting portion so that said projecting portion pushes said skeleton portion at a point adjacent to said micro-joint without contacting said micro-joint or said product, said punch and die being positioned relative to said skeleton portion by said aligning means such that said product is separated from said skeleton portion by pushing said skeleton portion adjacent to said micro-joint without contacting said micro-joint or said product.

2. The apparatus of claim 1, wherein said projecting portion is as small as said skeleton portion adjacent to said micro-joint.

3. Apparatus for separating a product from a skeleton portion of a workpiece at a micro-joint which joins the product to the skeleton portion of the workpiece and which is located directly adjacent to the product, comprising:

a punch provided with a projecting portion at an end thereof and movable up and down;

a die arranged with said punch and provided with an elastic substance;

aligning means for moving the workpiece in two directions in a plane of the workpiece until said die is aligned with said punch and said elastic substance is positioned opposite to said projecting portion of said punch; and means for moving said projecting portion so that said projecting portion pushes said skeleton portion at a point adjacent to said micro-joint without contacting said micro-joint or said product, said punch and die being positioned relative to said skeleton portion by said aligning means such that said product is separated from said skeleton portion by pushing said skeleton portion adjacent to said micro-joint without contacting said micro-joint or said product.

4. The apparatus of claim 3, wherein said projecting portion is as small as said skeleton portion adjacent to said micro-joint.

5. Apparatus for separating a skeleton portion of a workpiece from a product at a micro-joint which joins the product to the skeleton portion of the workpiece, and which is located directly adjacent to the product, said apparatus comprising:

punch means including a projecting portion for moving toward and impacting the skeleton portion of the workpiece;

a die disposed under said punch means, said punch means and said die defining a work position therebetween;

aligning means for moving the workpiece in two directions in a plane of the workpiece until said die is aligned with said punch and a specific part of the skeleton portion of the workpiece in close vicinity of the micro-joint is located just over the die and just under the projecting portion of the punch; and moving means for moving said punch means toward said die;

wherein said projecting portion pushes said specific part of said skeleton portion without contacting said micro-joint or said project, thereby causing said product to be separated from said skeleton portion of said micro-joint.

6. The apparatus of claim 5, wherein said die is at least partially formed from an elastic substance, said specific part of said skeleton portion being displaced by the pushing of said projecting portion, thereby facilitating separation of said skeleton portion of said workpiece from said product.

7. The apparatus of claim 6, wherein said die is entirely formed of an elastic substance.

8. Apparatus for separating a product connected to a skeleton portion of a workpiece at a micro joint which is located directly adjacent to said product, comprising:

a punch provided with a projecting portion at an end thereof and movable up and down;

a die arranged under said punch and formed of an elastic substance;

aligning means comprising work clamps for clamping the workpiece so as to move the workpiece in two directions in a plane of the workpiece until a specific part of the skeleton portion in close vicinity of the micro joint is located just over the die and just under the projecting portion of the punch; and means for moving said projecting portion so that said projecting portion pushes said skeleton portion at a point adjacent to said micro-joint without contacting said micro-joint or said product, said punch and die being positioned relative to said skeleton portion by said aligning means such that said product is separated from said skeleton portion by pushing said skeleton portion adjacent to said micro-joint without contacting said micro-joint or said product.

* * * * *